(12) United States Patent
Chien et al.

(10) Patent No.: US 9,657,924 B2
(45) Date of Patent: *May 23, 2017

(54) LED 3D CURVED LEAD FRAME OF ILLUMINATION DEVICE

(71) Applicant: LongWide Technology Inc., Nantou County (TW)

(72) Inventors: Huan-Jan Chien, Hsinchu County (TW); Tsung-Hong Tsai, Nantou County (TW)

(73) Assignee: LONGWIDE TECHNOLOGY INC., Nantou County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/943,201

(22) Filed: Nov. 17, 2015

(65) Prior Publication Data

US 2016/0069544 A1    Mar. 10, 2016

Related U.S. Application Data

(63) Continuation of application No. 13/734,603, filed on Jan. 4, 2013.

(30) Foreign Application Priority Data

Jan. 12, 2012    (TW) .............................. 101101175 A

(51) Int. Cl.
*F21V 21/00*    (2006.01)
*F21V 15/01*    (2006.01)
(Continued)

(52) U.S. Cl.
CPC .............. *F21V 21/00* (2013.01); *F21K 9/232* (2016.08); *F21V 15/01* (2013.01); *F21V 23/001* (2013.01);
(Continued)

(58) Field of Classification Search
CPC ........ F21V 21/00; F21V 29/773; F21V 15/01; F21V 23/001; F21K 9/232; F21K 15/001;
(Continued)

(56) References Cited

U.S. PATENT DOCUMENTS

| 7,086,756 B2 * | 8/2006 | Maxik | ..................... F21K 9/135 |
| | | | 362/249.04 |
| 2005/0174769 A1 * | 8/2005 | Yong | ....................... F21K 9/135 |
| | | | 362/235 |

(Continued)

*Primary Examiner* — Laura Tso
(74) *Attorney, Agent, or Firm* — Ming Chow; Sinorica, LLC

(57) ABSTRACT

A 3D curved structure and LED 3D curved lead frame for a curved surface illumination of an illumination device. First of all, draw illumination circuit with banded structure of multilayer lead frame on 3D illumination curved surface, then spread these curved circuit into plane circuit, dismantle the banded structure of multilayer lead frame of circuit into circuit pattern of single layers, use process the prototype of circuit patterns of each layer with conductive metal charge tape, and produce the prototype of banded structure of multilayer conductive frame through repeated accumulation of multi-disc charge tapes, and install the LED chip on the installation seat to get LED flat lead frame, then flex the conductive metal into LED 3D curved lead frame with jig and paste on the luminous curved surface, and package them with transparent material.

1 Claim, 10 Drawing Sheets

(51) Int. Cl.
*H05K 3/20* (2006.01)
*F21V 29/77* (2015.01)
*F21V 23/00* (2015.01)
*F21K 9/232* (2016.01)
*H05K 1/18* (2006.01)
*F21Y 101/00* (2016.01)
*F21Y 115/10* (2016.01)
*F21Y 107/20* (2016.01)
*F21Y 113/13* (2016.01)
*F21Y 113/17* (2016.01)

(52) U.S. Cl.
CPC ........... *F21V 29/773* (2015.01); *H05K 1/181* (2013.01); *H05K 3/202* (2013.01); *F21Y 2101/00* (2013.01); *F21Y 2107/20* (2016.08); *F21Y 2113/13* (2016.08); *F21Y 2113/17* (2016.08); *F21Y 2115/10* (2016.08); *H05K 1/189* (2013.01); *H05K 2201/0397* (2013.01); *H05K 2201/09263* (2013.01); *H05K 2201/10106* (2013.01)

(58) Field of Classification Search
CPC ........ H05K 1/181; H05K 3/202; H05K 1/189; H05K 2201/0397; H05K 2201/09263; H05K 2201/10106; F21Y 2107/20; F21Y 2113/17; F21Y 2115/10; F21Y 2101/00
USPC .......................... 362/249.02, 249.03, 249.04
See application file for complete search history.

(56) References Cited

U.S. PATENT DOCUMENTS

| | | | |
|---|---|---|---|
| 2007/0087643 A1* | 4/2007 | Jeganathan | F21K 9/00 445/1 |
| 2011/0074290 A1* | 3/2011 | Sakai | F21K 9/135 315/32 |
| 2012/0250323 A1* | 10/2012 | Velu | F21V 29/004 362/249.02 |
| 2013/0010472 A1* | 1/2013 | Li | F21V 29/2231 362/249.02 |

* cited by examiner

LED 3D CURVED LEAD FRAME OF ILLUMINATION DEVICE

CROSS-REFERENCE

This application is a continuation application of U.S. patent application Ser. No. 13/734,603 filed on Jan. 4, 2013, which claimed a foreign priority to the patent application of Taiwan No. 101101175 filed on Jan. 12, 2012.

SUMMARY OF THE INVENTION

This invention is to separately produce the complicated 3D curved structure and LED 3D curved lead frame, spread the curved luminous circuit into plane circuit, and utilize conductive metal charge tape to produce lead frames of single layers and accumulate into banded structure of multilayer lead frame, and install LED chip on the installation seat and form LED flat lead frame, then use ductility and plastic deformation features of conductive metal to flex into LED 3D curved lead frame, and paste on the complicated curved surface of the metal part, package into one body with transparent materials such as hardened resin or silica gel, for example, decorative lighting, curved display advertising board and other curved illumination devices; this method offers more flexibility for structure and aesthetic design, and fully utilizes the high heat dissipation capacity of main body of metal part.

PRIOR ART

LED chip has been used very commonly in recent years. These LED chips include: packaged LED, SMD LED and bare chip LED, in which electrode contact of packaged LED includes two-contact or plural contact. Those with exposed electrode pin can be divided into two-row upright type or horizontal type; SMD LED belongs to surface mounted package. Those with electrode pins on the underside of chip package and not stretched out and exposed, such as PLCC/SMD/SMT, are called chip LED; bare chip LED belongs to bare chips, which can be further divided into coplanar electrode, top and bottom plane electrode and flip chip electrode according to the position of electrode contact. Bare chip LED must be installed on one specific baseplate and package with transparent material; the number of bare chips of internal package of the above packaged LED and SMD LED can be more than one chip, containing protective Zener diode, in addition, the chip arrangement can be parallel connection, series connection, and mixing of series and parallel connection; and the illumination colors of LED chip contain monochromatic, multicolor and white light, in which white light can be got from more than three pieces of multicolor LED chips or got by adding fluorescent powder on LED chip, and multicolor can be got mainly from RGB chips, sometimes, other chips will be added to meet the color demand, or white light chip assembly is directly added.

These LED chips can be installed in many ways according the application, for example, ceramic baseplate, hard printed circuit board (PCB), flexible PCB, plastic baseplate and flexible wire; packaged LED is often installed on the flexible wire. SMD LED can be applied for most of purposes, such as ceramic baseplate, hard PCB, flexible PCB and plastic baseplate.

The conductive adhesives commonly used for installation of LED chip includes solder paste, conductive adhesive and high-molecular conductive adhesive. After installing these conductive adhesives on electrode contact of installation position, install LED chip to get the welding effect through heating and solidification.

For the LED chips applied on multicolor advertising board, one method is to directly weld the LED chips with different colors on high density multilayer PCB, and directly drive these chips with drive baseplate and drive computer to generate multicolor image with high resolution; another method is to add the necessary circuit on bare LED chips and drive chips with several colors and package them together. The drive method will be changed into serial communication method. The resolution of this method is limited by the chip size, but the manufacturing cost can be greatly reduced, and this chip assembly also contains white light chip.

LED chips are used in broad scope including illumination, advertising board and multicolor decorative lighting, especially illumination application, but they are limited by illumination direction of LED, so the program that can realize even light scattering has become one of key points in prior art; concerning prior art of advertising board, in addition to improvement of high resolution and bright color. The cylinder-shape advertising boards consisting of several PCBs are also commonly seen in prior art; for the prior art in relation to multicolor decorative lighting, in addition to common multicolor light bar, the newest 3D circuit technology has been introduced to enable plastic injection molded luminaire to generate chemical plating or electroplating metal conductive circuit on their curved surface so that the LED chip can be installed on the curved surface.

Relevant illumination device program of prior art is explained as follows:

Prima Facie Case 1:

Taiwan Patent Application No. 200914762 entitled "LED luminaire and its pedestal" filed in 2009 relates to the illumination demand of street lamp to state that the pedestal of luminaire consists of adjacent and successive multiplane baseplate with unequal dip angle, install at least one packaged LED in each plane to enable each LED light source to be under electric control according to the angle of projection, and each LED projection light in one specific area and to be overlapped with the adjacent LED light, thus accomplishing continuous, successive and even illumination effect and spreading the illumination scope. The lamp housing surface is equipped with heat dissipating fin; the multiplane baseplate curved surface of this Prima Facie Case offers the detailed practice for the light distribution and improvement, but the periphery of multiplane baseplate is installed on the positioning frame of inside periphery of lamp housing. In addition, one transparent lamp shade is equipped on the bottom of lamp housing, which is able to cover the periphery of multiplane baseplate, enabling the heat generated from LED chip on the plane baseplate not to be rapidly dissipated from the heat dissipating fin of lamp housing surface.

Prima Facie Case 2:

U.S. Pat. No. 7,443,678B2 entitled "Flexible PCB with heat sink" filed in 2008 uses flexible PCB, which is equipped with circuit substrate, heat conduction substrate and radiator on its top. In its flexible PCB, the first trough of heat conduction substrate and the second trough of the radiator will provide the buffer space when this flexible PCB is bending. There is one platform between the troughs of heat conduction substrate for carrying the circuit substrate. When this Prima Facie Case is used in high power LED illumination device, the focusing position of light will be adjusted as trough width is folded; the embodiment of this Prima Facie Case indicates that the flexible PCB can provide cylindrical light source structure of different focusing radius. But the 3D curved or spherical application is not further explained.

Prima Facie Case 3:

Taiwan Patent No. 339252 relates to "Illumination module of LED luminaire" filed in 2011. This Prima Facie Case is featured by making the light ejection axle of each LED illumination member face to this reflector, thus enabling LED luminaire to illuminate more evenly; and the radiator base is equipped with fan to increase the heat dissipating effect of stream guidance surface. The newly increased fan of this Prima Facie Case makes convection cooling effect enhanced, but cooling fan and other parts should be increased. In addition, the angle of projection light of LED illumination member is likely more than 100 conicity, unless the reflector has enough length or special design, that is, part of light will be directly projected to outside, and a part of light will be projected on the reflector, and multiple reflection will also cause attenuation of illumination, and the irregular reflection surface required by the reflector will result in more difficulty and cost.

Prima Facie Case 4:

China Patent No. 1719095A relates to "LED ball lighting lamp" filed in 2006. This Prima Facie Case installs flexible PCB of LED chip on the spherical or multilateral spherical surfaces of engineering plastics, and cover or package into LED spherical lamp with transparent material outside the sphere. This Prima Facie Case is perhaps used for decoration lamp or illumination, but further instructions are not available, but dissipation program required for high power LED illumination; in addition, another similar patent: Taiwan Utility Patent No. M385637 of "New type of LED light source structure" filed in 2010, which installed the several flexible PCBs on LED illumination assembly, and installed on the external surface of the sphere and other intervals, thus resulting in full-spherical illumination effect.

Prima Facie Case 5:

Japan Patent Application No. JP2011096594A relates to "Bulb type led lamp" filed in 2011. This Prima Facie Case is featured by setting up the projecting multiplane structure on the top end of frame body of the bulb, another multiplane shell structure sunk in the center of inside can be compacted and cup jointed on the outer surface of this projecting structure. LED chip is installed on each external surface of construction part of this shell, and the structure of this multiplane shell is made by flexing the metal plate with circuit, and preserved with electrode contact to link with the circuit of frame body to broaden radiation scope of LED light source and enhance the heat dissipation capacity; the heat of LED chip of this Prima Facie Case is scattered from frame body, but the number of the installed LED chips when higher brightness is required will become more. The arrangement of series and parallel circuit between LED chips should be explained more definitely; another similar patent is Taiwan Utility Patent No. M405524 relates to "LED three-dimensional bulb" filed in 2011, this patent also has similar rising structure and several inclined loading surfaces at different direction of the circumference. LED light source body is installed in these loading surfaces.

Prima Facie Case 6:

Taiwan Utility Patent No. M343884 relates to "the ring-shaped composite structure of LED advertising board" filed in 2008. This invention is about the ring-shaped composite structure of one kind of LED advertising board, this LED advertising board consists of plural baseplate and plural illumination module, and the baseplates can respectively fixed on ring-shaped support. The luminous surface of such illumination module is connected with interstitial-free ring-shaped display surface so that the words and patterns presented on this ring-shaped display surface can be watched in different angles, and the words and patterns have coherence; the illumination module of this Prima Facie Case contains monochromatic LED, white light LED and RGB full-color LED. It is known from numerous signal pins of illumination module that, precise multilayer PCB must be used to install these numerous LEDs, and the control signal of the baseplate should be also used to enable the annular display surface to accomplish dynamic display effect, but it is still limited by PCB and unable to obtain the display function of 3D curved surface.

Prima Facie Case 7:

Germany Patent No. DE202010008460U1 relates to "Modulierte LED Anzeigetafelanordnung and deren System" filed in 2011. This Prima Facie Case is one kind of modularized LED display board structure and its system. The flexible PCB is equipped with plural full-color LED units to form one matrix, and the signal connection among modularized LED display boards is used to form large-scale LED display system; this Prima Facie Case adopts full-color LED chip unit containing drive mechanism, so the display function can be acquired only from the flexible board, but it is still limited by flexible PCB, causing that the display function of 3D curved surface cannot be produced.

Prima Facie Case 8:

Taiwan Design No. D141427 relates to "LED luminaire" filed in 2011. This Prima Facie Case is one kind of LED luminaire made of 3D circuit. The appearance feature is that the lamp socket appears semi-arc shaped 3D curved surface, 3D curved surface has 3D circuit, LED is placed on 3D circuit under the arrangement of specific patterns, and emerging light also appears as 3D linear distribution; LED luminaire of this Prima Facie Case uses three-dimensional molded interconnect device (3D-MID), and the method is laser direct structuring (LDS). The laser will directly draw 3D circuit diagram on the activated plastic surface, and the activated plastic surface can form conductive circuit with chemical deposition method, which needs large quantity of chemical liquid medicine to get enough thickness of conductive circuit, or need many times of different liquid medicine to deposit different conductive metal on the circuit, that is, the manufacturing method faces environmental protection problem like PCB. PCT Patent Application No. WO2011041934A1 relates to "Semiconductor carrier structure" filed in 2011 also adopts similar method, and it is unable to utilize the heat dissipation capacity of metal part either.

Prima Facie Case 9:

Taiwan Patent Application No. 100142476 relates to "Integrated illumination part and lead frame of umbrella" filed in 2011. This Prima Facie Case is one kind of annular lead frame installed with LED chip, used to install on the surface of main body of umbrella part, and both ones are packaged together. The feature is to first produce LED lead frame on tabular conductive metal, then bend into annular lead frame for being installed on the umbrella part, this feature is suitable for series and parallel connection of composite circuit and installation the surface of circumferential plane; this Prima Facie Case does not conduct further invention for the application of curved surface illumination.

The above solutions just explain the demands of LED chip applied in luminaire or advertising board, which are settled and introduced as follows:

Demand 1: Heat Dissipation

For example, Prima Facie Case 2, Prima Facie Case 3 and Prima Facie Case 5 have the solutions in relation to heat dissipation demand; Prima Facie Case 2 and Prima Facie Case 3 paste PCB on the metal part surface; and Prima Facie Case 3 even performs forced cooling with fan; and the luminous LED chip of Prima Facie Case 5 is really pasted and fixed on the metal part surface. Heat dissipating effect of metal part cannot be fully utilized due to low heat dissipation efficiency of PCB, so increase of fan will increase the risk of part failure.

Demand 2: Distribution Direction of Illumination Light

For example, Prima Facie Case 1, Prima Facie Case 2, Prima Facie Case 4, Prima Facie Case 5, Prima Facie Case 8 and Prima Facie Case 9 depend on 3D structure to accomplish the required illumination effect; some of Prima Facie Cases have solutions in relation to heat dissipating demand, only the solution of Prima Facie Case 9 is relative concise, which can meet the demand of 3D projection directions.

Demand 3: Decoration

For example, Prima Facie Case 4, Prima Facie Case 5, Prima Facie Case 8 and Prima Facie Case 9 have solutions in relation to the decoration demand of LED luminaire, and all of these solutions use 3D structure and multicolor LED chip to accomplish the required decoration effect, but complicated 3D curved illumination structure is not further explained.

Demand 4: Easy Manufacturing and Installation

For example, Prima Facie Case 4 pastes flexible PCB on spherical plan, Japanese patent of Prima Facie Case 5 first installs LED chip and circuit on the metal plate, then use flexing method of metal plate, for example, Prima Facie Case 8 directly uses LDS to establish circuit and weld LED chip on the plastic curved surface. For example, Prima Facie Case 9 first produces LED lead frame on tabular conductive sheet metal, then bend into annular lead frame to be installed on the umbrella part. These Prima Facie Cases separate the production of 3D structure and LED illumination device, but no further explanation is provided for the solution for complicated 3D illumination curved surface, and Prima Facie Case 8 can be only used for plastic parts, which cannot use metal part to dissipate heat.

Demand 5: Multicolor Advertising Board

For example, Prima Facie Case 6 uses LED module structure to constitute annular display panel, and accomplish dynamic display via control baseplate. For example, Prima Facie Case 7 uses full-color LED chip unit that contains drive mechanism, so only serial communication method is used to accomplish dynamic display function of advertising board on flexible printed circuit (FPC), but FPC is only suitable for flat or cylindrical surface, which is unable to meet the demand of 3D curved advertising board.

Prima Facie Cases of the above prior art propose solutions for the specific demands, and there is no more flexible practice that can meet the demand of complicated 3D illumination curved surface. This invention conducts research and development for the aforementioned demands, introduces the concept of separated production of complicated curved surface structure and LED 3D curved lead frame of 3D illumination curved surface, enabling the innovative 3D curved lead frame to fully meet the above five demands when it is applied in LED illumination device, without environmental protection of chemical plating or electroplating metal wire.

DETAILED DESCRIPTION OF THE INVENTION

Figure 1:
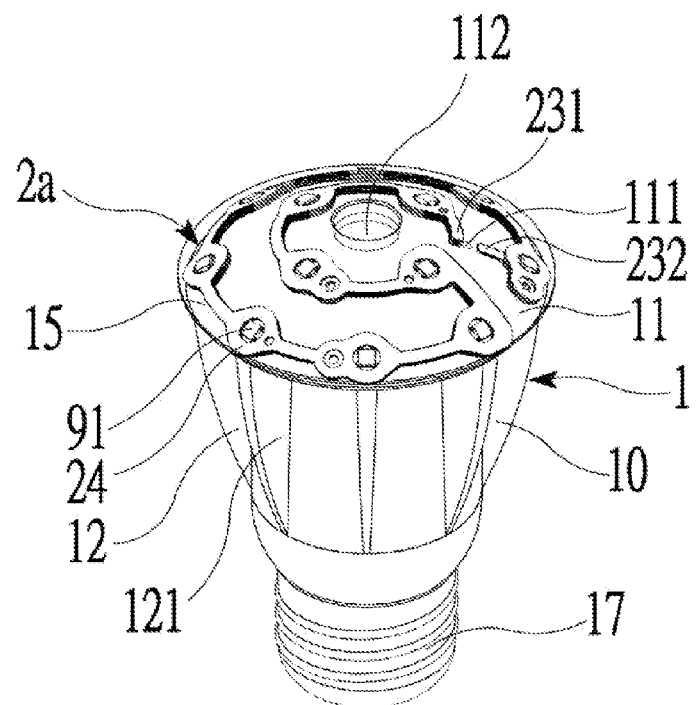
FIG. 1 illustrates external structure of white light luminaire in accordance with the first embodiment of the present invention.

This invention separately produces the complicated 3D curved structure and LED 3D curved lead frame to meet the illumination demand of complicated curved surface of illumination device, thus enabling the producing difficulty in installing LED chip and circuit on illumination curved surface to be substantially reduced, structure and aesthetic design flexibility to be bigger, and fully utilizing the high heat dissipation capacity of main body of metal part.

The key to this method is the bent strip-shaped circuit made of multilayer lead frame, and the circuit can meet the demand of series connection, parallel connection and mixing of series and parallel connection, that is, it can very easily depict the bent strip-shaped circuit on the illumination curved surface. The circuit of complicated 3D curved surface can be cut into many circuit units, and can 3D curved circuit pattern of each circuit unit can be spread into one plane circuit pattern.

Plane circuit, that is, the spread plane strip-shaped circuit has multilayer lead frame accumulated by conductive sheet metal, and the constituting plane circuit pattern can be concentric circles curve, repeated arrangement curve or other types of patterns. The installation seat of multilayer lead frame is installed with LED chip to get LED flat lead frame. The light of LED chips on these circuit patterns will also meet the demand of the original illumination curved surface.

Because the conductive metal of multilayer lead frame has ductility and plastic deformation features, LED flat lead frame can be flexed into LED 3D curved lead frame with jig, and pasted on the required illumination curved surface. For complicated curved surface, multi-disc 3D curved lead frame can be used to form the required curved surface of luminous surface, then package into one body with transparent materials such as hardened resin or silica gel, for example, decorative lighting, curved display advertising board and other 3D curved illumination devices.

Multilayer lead frame is one electrical insulation flaky conductive metal multilayer circuit structure accumulated by multidisc monolithic lead frames, and conductive metal underside and thickness broadside of monolithic lead frame have electric insulating layers, and the appearance is the bent strip-shaped and contains installation seat of LED chip, which is suitable for the bent strip-shaped circuit design of complicated illumination curved surface.

The structure of monolithic lead frame must meet the demand of series circuit, parallel circuit and mixed series and parallel circuit, that is, the circuit in the multilayer lead frame structure consists of monolithic lead frames with different structure, and as required by mixed series and parallel circuit. The length of monolithic lead frame will be divided into several circuit sections isolated by insulating joint according to the demand, and the length and shape of each circuit section will not be same or similar for sure. It is hereinafter referred to as circuit section in order to meet the demand of mixed series and parallel circuit, each single-layer lead frame is consisted of at least one or more circuit sections.

The part of each circuit section structure can be assembled in different ways according to the purpose and circuit demand, which may contain: wire, power contact, installation seat, conductive through hole, insulating through hole, potential chain contact and signal contact, which will be assembled by the above parts or all parts according to the demand, and each assembled position should have at least one or more parts; the main position is one or more installation seats, which is connected by plural pieces of wire. Power contact, signal contact and other positions are located on one end of circuit section, which is used to connect control circuit and signal circuit; conductive through hole, insulating through hole and potential chain contact are located on wire or installation seat, which are used to meet the demand of circuit's series connection, parallel connection, and mixed series and parallel circuit.

Where the installation seat wire of circuit section is equipped with insulating joint, one circuit section will be divided into several conductive sheet metals isolated by insulating joint conductive sheet metals. In addition, the installation seat wire is respectively equipped with electrode contact of one group of high and low potential, then such circuit section can apply to serial lead frame with series circuit.

The installation seat wire of circuit section is changed into integrated wire, appearing strip shape, hollow annular or rectangular or solid tabular shape, electrode contact of one group of high or low potential is equipped above, then such circuit section can apply to parallel circuit, which can provide high or low potential for mixed series and parallel circuit, belonging to continuous lead frame.

To enable the multilayer-superimposed lead frame to meet the demand of mixed series and parallel circuit, the wire, installation seat, potential connecting point or power contact will be equipped with conductive through hole and insulating through hole to constitute high potential or low potential contact.

The conductive through hole is used to prime conductive adhesive to enable the circuit section's conductive metal of the lead frame with two superimposed pieces on the top and bottom to have the same potential. The conductive through hole is only installed on the lead frame that requires the same potential, and the superimposed lead frame on rock bottom does not have any conductive through hole. When conductive adhesive is totally filed in the conductive through hole, the superimposed lead frames will have the same potential.

Where circuit section's conductive metal of lead frame with over two superimposed layers up and down in the middle layer of multilayer-superimposed lead frame need to be connected into the same potential with conductive through hole. The other layers above must be insulated. Other layers of these different potential will be installed with insulating through hole with aperture more than conductive through hole and inner wall with insulating layer to ensure other conductive metal of lead frame that should be insulated will not be broke over conductive adhesive is injected.

When the circuit section of multilayer-superimposed lead frame that need the same potential is not located under the superimposed up and down relation, conductive through hole should be penetrated into conductive metal wire and pasted with conductive adhesive to ensure to get the required the same potential. The lead frame on the bottom layer does not have any conductive through hole but directly contacts conductive metal wire and is connected and broken over with conductive adhesive, and other monolithic lead frames with different potential are equipped with insulating through holes to enable the conductive metal wire to pass through, and the inner wall has insulating layer, which will not cause break-over situation; if conductive through hole is installed on the potential connecting point or power contact, and both ones are located at broadside of wire or installation seat and stretched outward. The other monolithic lead frames with different potential will not need insulating through hole, only conductive metal wire should be penetrated in conductive through hole with the assistance of conductive adhesive.

Where the lead frame with over two superimposed pieces of multilayer-superimposed lead frame has series circuit, the insulating joint of wire on installation seat of each single-layer lead frame should be mutually staggered to ensure structure intensity of the superimposed installation seat to meet the demand for installing LED chip.

After the installation seat of multilayer lead frame superimposed by each single-layer lead frame is superimposed. The electrode contact on installation seat wire should be mutually staggered, and high and low electrode contact is separately located on relative positions to form multiple high and low potential electrode contact groups to join the electrode contact on the LED chip, and the electrode contact is flexed on the same horizontal position in order to install the LED chip.

Another purpose of the present invention is to further explain the method that sheet metal is produced into similar cellular charge tape to manufacture LED flat lead frame, and use embodiment to give detailed explanation for the manufacturability of the manufacturing method of the present invention and prove the flexibility for small-scale production. Processing method of LED flat lead frame is explained as follows:

LED curved illumination device of the present invention is to properly design to LED circuit to be designed, then spread the circuit pattern shape on the curved surface into circuit pattern of plane structure. It is possible to divide the curved circuit diagram into over one piece of circuit pattern of plane structure as required, each circuit pattern in this place is designed into one circuit with curve banded structure, and each circuit contains the possible position combination of monolithic single-layer lead frame structure, enabling the circuit of each single-layer lead frame to be drawn on different strip-shaped sheet metals, and each sheet metal to produced into charge tape with machining method; the section thickness of main body of strip-shaped conductive metal is from more than 0.05 mm to less than 2 mm, and section width is from more than 1 mm to less than 10 mm; conductive metal contains: ferrous metal, non-ferrous metal and copper foil sheet with insulating layer; for the convenience of production, the common practice is to properly arrange the patterns of single-layer lead frame on banded metal plate, and increase the plural required connecting parts with different shapes to enable circuit conductive sheet metals of each single-layer lead frame to be connected as cellular charge tape structure, and processed into cellular charge tape with location hold for superimposing multilayer charge tapes and installing LED chip. It is hereinafter referred to as charge tape, according to different demand of LED chip, and the demand of circuit under parallel connection, series connection and mixed series and parallel connection. The conductive sheet metal structure of each piece of charge tape can be designed in different ways according to the demand.

According to the demand of LED chip and circuit, superimpose the charge tapes of multilayer, then install LED chip. Each layer of charge tape has heat conduction insulating layer, such as insulating varnish, to prevent short circuit. The multilayer charge tape will have excellent structural rigidity after being bonded with insulating heat conduction cement, suitable for installation of LED chip and further processing.

After the superimposed charge tapes are installed on the jig, LED chip can be installed on the installation seat. Inject conductive adhesive on each electrode contact of each installation seat and paste LED chip, conduct heating and solid jointing to make LED chip stable and fixed, thus cutting off the connecting part on the charge tape and cutting the part into individual part, at this time, the multilayer-superimposed LED plane wire will be obtained.

The solution proposed of the present invention can improve the functions of LED curved illumination device and accomplish the following effects:

Effect 1. The wire of LED 3D curved lead frame and the underside of installation seat are pasted on main body surface of the part, which can provide large-area heat dissipating efficiency, and main body structure of the part makes it easier to design heat dissipating method with up and down convection.

Effect 2. LED 3D curved lead frame can be installed according to the curved surface of light projection direction, with no need to consider how to respectively install each LED chip on the complicated curved surface, thus easily designing the required brightness distribution method and increasing lots of aesthetic designs.

Effect 3. The aesthetic design space of main part body of LED curved illumination device can be substantially improved, no problem about difficulty in LED chip installation, because LED 3D curved lead frame can be completely adhered on the complicated curved surface of main part body, even can be conveniently packed with transparent materials, especially multilayer-superimposed lead frame structure will be more suitable to use multicolor LED chip to enable the illumination device to accomplish optical and aesthetic effects.

Effect 4. The mass production of lead frame charge tape made of conductive metal charge tape can meet the demand of small-scale production, especially small-scale ornament can be processed by means of laser cutting or water jet cutting or CNC machinery cutting, and large-scale products can be produced with precise stamping die, even removing the mass production requirements for chemical process and environmental pollution problem caused by chemicals.

Effect 5. When full-color LED chip unit that contains drive mechanism is used for LED 3D curved lead frame, dynamic display advertising board function will be realized on various curved or spherical planes. The interval between chips is relatively big. The resolution will slightly reduce, but LED 3D curved lead frame can be produced into curved and spherical planes with different sizes, and serial communication method has been widely applied in the industrial circles so that the setting cost can be substantially reduced.

Implementation Method

In order to give a specific explanation of LED 3D curved lead frame of illumination device of the present invention. The following embodiments will be used for further revealing, but it is not subject to the following embodiments. For the sake of clear explanation, the thickness of insulating layer in the descriptions of the following embodiments is not the actual thickness, which is used for explanation only. All parts can meet the necessary requirements for electric insulation and electric safety.

Embodiment 1 is LED 3D curved lead frame of the present invention applied in white light luminaire with function of illumination curved surface.

Figure 2:
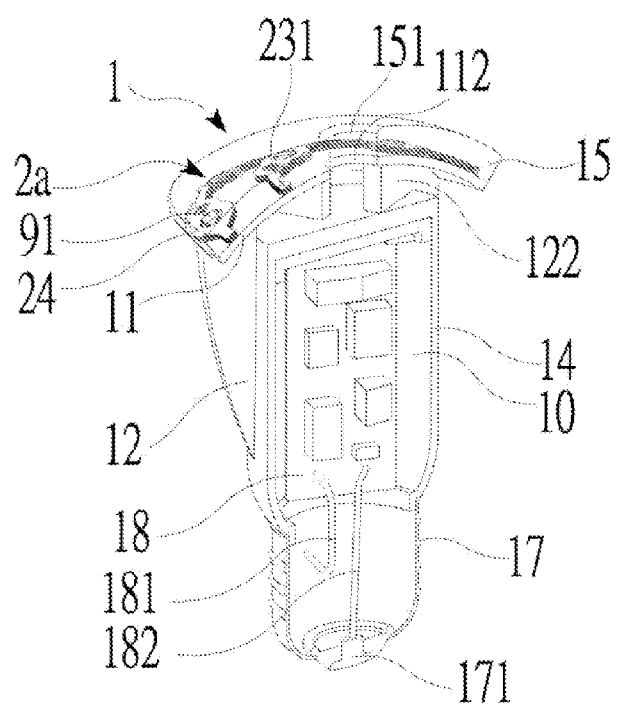
FIG. 2 illustrates profile structure of white light luminaire in accordance with the first embodiment of the present invention.

Please refer to FIG. 1 and FIG. 2, the external structure diagram of white light luminaire of Embodiment 1 of the present invention. Luminaire 1 contains aluminum alloy main body 10; illumination curved surface 11, heat dissipating fin 12, LED 3D curved lead frame 2a, spiral joint 17, white light LED chip 91, and transparent package 15; when the luminaire in this embodiment is installed on the ceiling. The spiral joint 17 is located at the top; illumination curved surface 11 is located at the bottom, and illumination curved surface 11 becomes spherical shape and connects with heat dissipating fin 12. LED 3D curved lead frame 2a is installed on illumination curved surface 11. The surface has transparent package 15, which is used to protect LED 3D curved lead frame 2a and LED chip 91, and 12 white light LED chips 91 is installed in installation seat 24 to form mixed series and parallel circuit. Power hole 111 on illumination curved surface 11 of LED chip 91 is used to make power wire connected from inside of main body 10 to power contact 231 and power contact 232 of LED 3D curved lead frame 2a. Main body 10 has outward extended heat dissipating fin 12, first extending downward to lateral part of heat dissipating fin 121 at external broadside. Illumination curved surface 11 is equipped with air hole 112 in the middle to enable the heat generated from white light LED chip 91 on LED 3D curved lead frame 2a to be directly transferred to heat dissipating fin 12 via aluminum alloy illumination curved surface 11, that is, the heat can be directly dissipated from the back of illumination curved surface 11 and the surface of heat dissipating fin 12. Because white light LED chip 91 and illumination curved surface 11 are located below, when the heat is transmitted to heat dissipating fin 12. The external surface of heat dissipating fin 12 will heat the air to enable the hot air to ascend and flow due to buoyancy along lateral part of heat dissipating fin 121 at external broadside, that is, the cold air will constantly flow in through air hole 112 to cool the back of illumination curved surface 11 and heat dissipating fin 12; if luminaire 1 is installed at the opposite direction. The cooled air will also flow at the opposite direction, and large quantity of hot air will flow out through air hole 112; these air flows can reduce the thickness of thermal boundary layer of heat dissipating surface, and increase heat convection coefficient and help the heat dissipation; because LED 3D curved lead frame 2a is installed on the projecting illumination curved surface 11, light projection direction of luminaire 1 will be very easily controlled according to radius of curvature of illumination curved surface 11. The bigger the radius of curvature is, the more uniform the light will project downward; and the smaller the radius of curvature is, the bigger light projection angle will be; if illumination curved surface 11 is indented spherical surface. The bigger the radius of curvature is, the longer focusing distance of light will be; and the smaller radius of curvature is, the shorter focusing distance of light will be; if the brightness distribution of projection light should be further controlled, the circuit can be further divided into loop in smaller unit to generate more uniform projection light; because the position of white light LED chip 91 on illumination curved surface 11 is designed according to the demand of light projection, then design the required circuit on illumination curved surface 11, and spread curved circuit into plane circuit and produce into LED flat lead frame 2 (as per FIG. 3(A)). Therefore, LED 3D curved lead frame 2a can be correctly pasted on illumination curved surface 11 with insulating heat conduction cement 28 (as per FIG. 3(C)) in order to ensure the distribution of projection light is in conformity with the original design, and ensure to have the maximum heat dissipating area.

Please refer to FIG. 2, profile structure diagram of white light luminaire of Embodiment 1 of the present invention. When the luminaire of this embodiment is installed on the ceiling, spiral joint 17 is located at the top, illumination curved surface 11 is located at the bottom, and illumination curved surface 11 appears spherical shape and connects with heat dissipating fin lower part 122. LED 3D curved lead frame 2a is installed on illumination curved surface 11. The surface has transparent package 15 that is equipped with air hole 151 and connected with air hole 112; the inside of main body 10 is cylindrical space 14, where is installed with control circuit 18 in order to provide stable voltage and current to ensure the service life of white light LED chip 91. The high potential electrode contact is connected to power contact 171 on the front end of spiral joint 17 via wire 182, and the low potential electrode contact is connected to broadside of spiral joint 17 via wire 181; the space between cylindrical space 14 of main body 10 and illumination curved surface 11 is connected with heat dissipating fin lower part 122, enabling hot and cold air to generate convection. The heat generated by white light LED chip 91 will be first dissipated by heat dissipating fin lower part 122. Because the cooled air flow with natural convection is available. There will not be too much heat transmitted to cylindrical space 14 to influence control circuit 18, and the opening of cylindrical space 14 is sealed and combined with spiral joint 17, enabling the heat generated by control circuit 18 to be dissipated via the wall surface of cylindrical space 14 and lateral part of heat dissipating fin 121 (as per FIG. 1), and both of them have big heat dissipating surfaces.

Figure 3A:
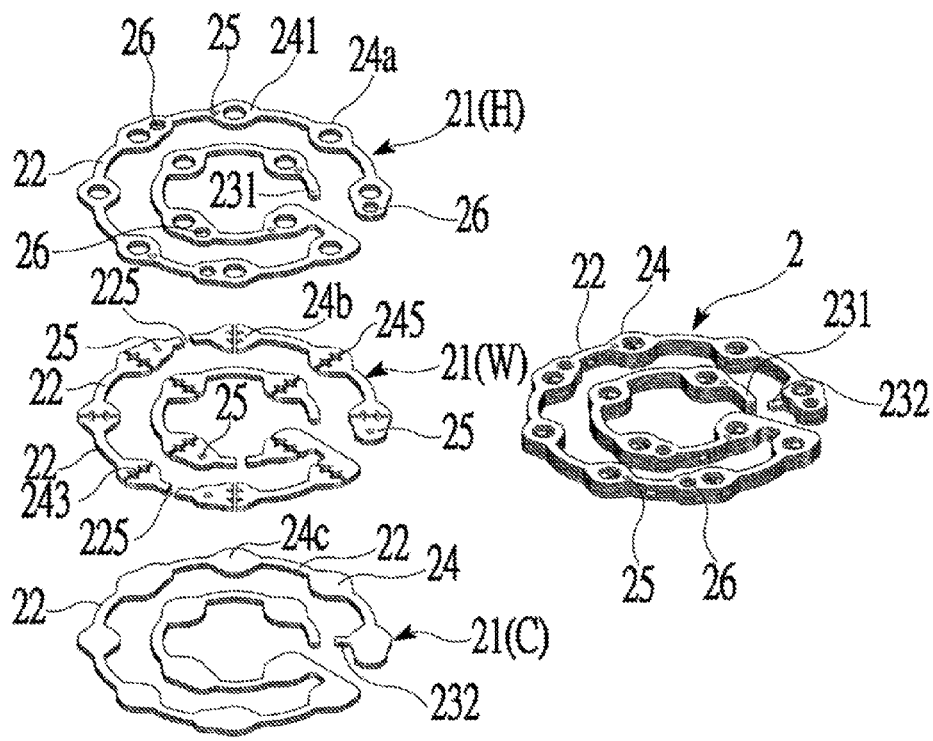
FIG. 3(A) illustrates layered structure of white light LED flat lead frame used in the first embodiment of the present invention, the circuit is in series connection and then parallel circuit.
Figure 3B:
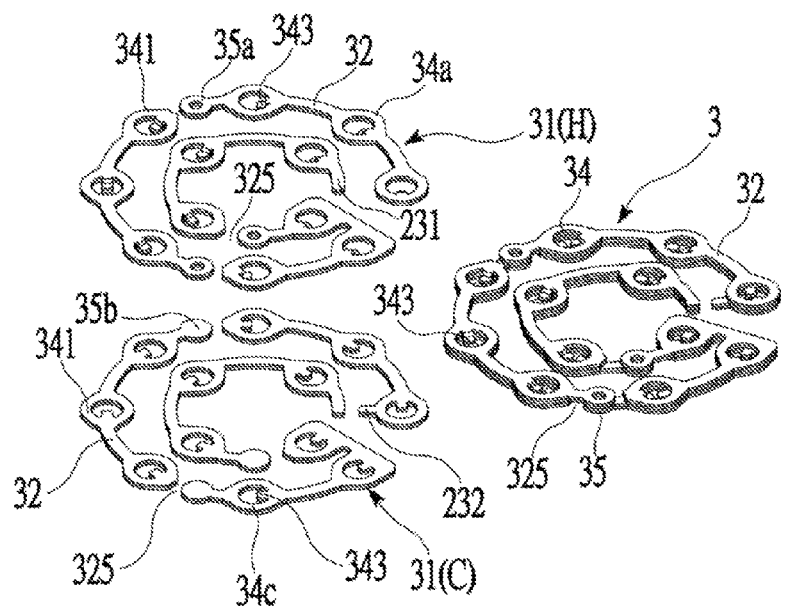
FIG. 3(B) illustrates layered structure of white light LED flat lead frame used in the first embodiment of the present invention, the circuit is in parallel connection and then series circuit.
Figure 3C:
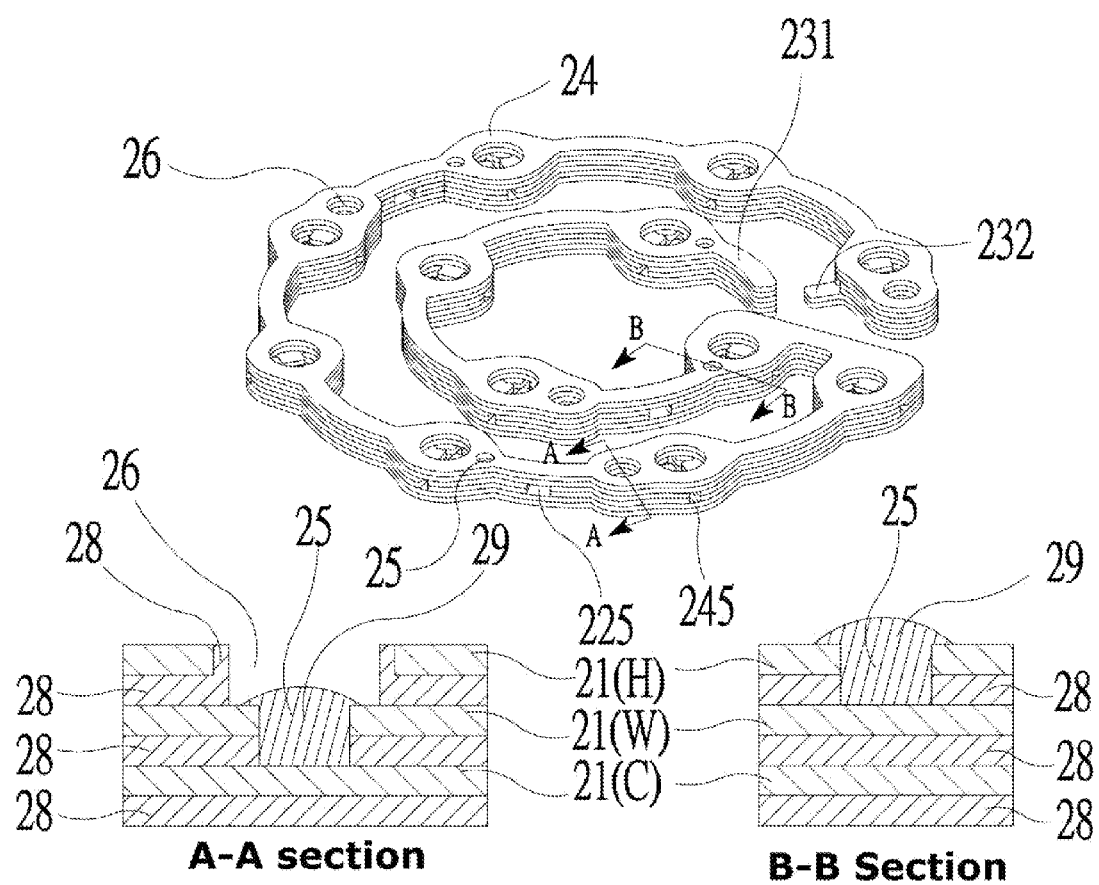
FIG. 3(C) illustrates profile structure of conductive through hole and insulating through hole of white light LED flat lead frame used in the first embodiment of the present invention.

Please refer to FIG. 2, FIG. 3(A) and FIG. 3(C), layered structure diagram of white light LED flat lead frame of Embodiment 1 of the present invention. The circuit of this embodiment includes four groups of three white light LED chips 91 under series connection and then parallel connection, totaling 12 LED chips 91. LED flat lead frame 2 has the plane circuit spread from illumination curved surface 11, consisting of two linked concentric circle arc curves. The middle arc is installed with four LED chips 91, and the peripheral arc is installed with eight LED chips 91, which are superimposed by three layers of monolithic lead frames 21.

High potential monolithic lead frame 21(H) belongs to continuous lead frame, which is used as high potential parallel contact of series circuit. Series circuit monolithic lead frame 21(W) is serial lead frame, which is divided into four series circuit sections by insulating joint 225 on wire 22 and used to constitute four groups of three white light LED chips 91 parallel circuit under series connection. Low potential monolithic lead 21(C) is continuous lead frame, which is used as low potential parallel contact of series circuit.

The structure of high potential monolithic lead frame 21(H) contains wire 22, installation seat 24a, power contact 231 and other parts; the front end of lead frame 21 is installed with one power contact 231 in order to connect control circuit 18; lead frame 21(H) is equipped with 12 installation seats 24a that are connected with wire 22, and installation seat 24a has hollow annular installation seat wire 241; wire 22 is installed with insulating through hole 26, which is used to avoid conductive adhesive 29 from high and low potential short circuit. The installation position is above conductive through hole 25 of each circuit section of series circuit monolithic lead frame 21(W); wire 22 is also installed with conductive through hole 25. The installation position is high potential end of each circuit section of series circuit monolithic lead frame 21(W), which is used to drip conductive adhesive 29 on high potential end of each circuit section of parallel monolithic lead frame 21(W), enabling monolithic lead frame 21(H) to become parallel contact of high potential.

The circuit in series circuit monolithic lead frame 21(W) is divided into four groups of parallel circuit sections with insulating joint 225 under series connection of three white light LED chips 91; the structure of each circuit section contains wire 22, installation seat 24b and other parts; each circuit section is equipped with three installation seats 24b that are connected with wire 22, and installation seat 24b is separated by insulating joint 245 and installation seat wire 241 to constitute one group of electrode contact 243 of high and low potential; high potential wire 22 on the front end of each circuit section is connected with conductive through hole 25 on high potential monolithic lead frame 21(H) by dripping conductive adhesive 29; low potential wire 22 on the tail end of each circuit section is equipped with conductive through hole 25, and low potential monolithic lead frame 21(C) is connected with conductive through hole 25 by dripping conductive adhesive 29.

The structure of low potential monolithic lead frame 21(C) contains wire 22, installation seat 24c, low potential power contact 232 and other parts; the tail end of lead frame 21 is installed with one low potential power contact 232, which is used to connect control circuit 18; lead frame 21(C) is equipped with 12 tabular installation seats 24c and connected with wire 22; conductive through hole 25 of monolithic lead frame 21(W) is dripped with conductive adhesive 29 to connect wire 22 of low potential monolithic lead frame 21(C), thus constituting low potential parallel contact.

Wire 22 and installation seat 24 of each monolithic lead frame 21 of LED flat lead frame 2 have the same overall dimension for superimposition. Installation seat 24 is superimposed by installation seat 24a, installation seat 24b and installation seat 24c. After each high and low potential electrode contact 243 is dripped with conductive adhesive 29, LED chip 91 can be installed in the internal space. The underside of monolithic lead frame 21(C) is directly pasted on illumination curved surface 11 with insulating heat conduction cement 28.

Please refer to FIG. 2 and FIG. 3(B), layered structure diagram of white light LED flat lead frame of Embodiment 1 of the present invention. The circuit of this embodiment includes four groups of three white light LED chips 91 under parallel connection and then series connection, totaling 12 LED chips 91. LED flat lead frame 2 has the plane circuit spread from illumination curved surface 11, consisting of two linked concentric circle arc curves. The middle arc is installed with four LED chips 91, and the peripheral arc is installed with eight LED chips 91, which are superimposed by two layers of monolithic lead frames 31.

High potential monolithic lead frame 31(H) belongs to continuous lead frame, which is divided into four circuit sections with insulating joint 325 on wire 32, and used as high potential of parallel circuit, but each circuit section has different potential. Low potential monolithic lead frame 31(C) belongs to continuous lead frame, which is divided into four circuit sections with insulating joint 325 on wire 32, and used as low potential of parallel circuit, but each circuit section has different potential; circuit sections of high and low potential constitute four groups of parallel circuit; and each parallel circuit depends on three chaining points 35 to accomplish series connection mechanism of high and low potential. Connecting point 35a of high potential monolithic lead frame 31(H) and connecting point 35b of low potential monolithic lead frame 31(C) are connected via conductive through hole 25 by dripping conductive adhesive 29 (as per FIG. 3(C)) to constitute series circuit.

High potential monolithic lead frame 31(H) is divided into four circuit sections with insulating joint 325 on wire 32. The structure of each circuit section contains wire 32, installation seat 34a, connecting point 35a, power contact 231 and other parts; the first circuit section is equipped with power contact 231 to connect high potential and control circuit 18, front end of the rest circuit section is equipped with potential connecting point 35a, that is equipped with conductive through hole 25 above to connect potential chain contact 35b of each circuit section of low potential monolithic lead frame 31(C) by dripping conductive adhesive 29; and each circuit section is equipped with three installation seats 34a and connected with wire 32, and one electrode contact 343 of high potential is equipped on hollow annular installation seat wire 341 of installation seat 34a.

low potential monolithic lead frame 31(C) is divided into four circuit sections with insulating joint 325 on wire 32; the structure of each circuit section contains wire 32, installation seat 34c, connecting point 35b, power contact 232 and other parts; and the tail end of the last circuit section is equipped with one low potential power contact 232, which is used to connect control circuit 18; the tail end of the rest circuit section is equipped with potential connecting point 35b, which is used to connect potential chain contact 35a of each circuit section of high potential monolithic lead frame 31(H); and each circuit section is equipped with three installation seats 34c and connected with wire 32, and one electrode contact 343 of low potential is equipped on hollow annular installation seat wire 341 of installation seat 34c.

Wire 32 and installation seat 34 of each monolithic lead frame 31 of LED flat lead frame 3 has the same overall dimension for superimposition. Installation seat 34 is superimposed by installation seat 34a and installation seat 34c. Electrode contact 343 on installation seat 34a and installation seat 34c is located in relative position to constitute one group of high and low potential electrode contact. Electrode contact 343 is processed and flexed to enable both of them to be at the same level. After each high and low potential electrode contact 343 is dripped with conductive adhesive 29, LED chip 91 can be installed in the internal space. The underside of monolithic lead frame 31(C) is directly pasted on illumination curved surface 11 with insulating heat conduction cement 28.

Embodiment 2 is LED 3D curved lead frame of the present invention that is applied in multicolor luminaire with illumination curved surface function.

Figure 4:
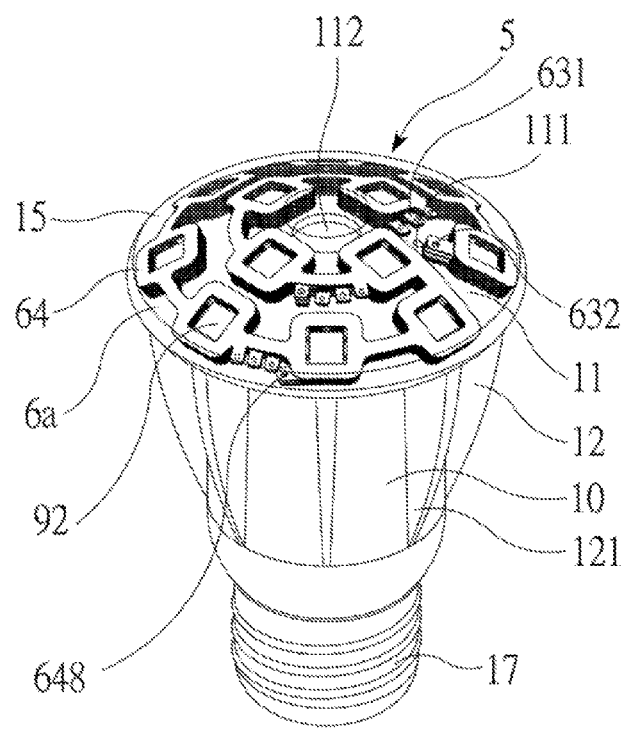
FIG. 4 illustrates external structure of multicolor luminaire used in the second embodiment of the present invention.
Figure 5:
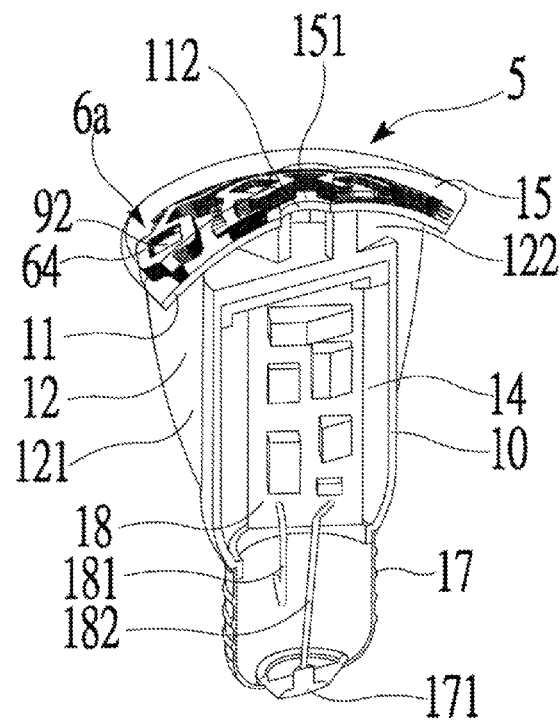
FIG. 5 illustrates profile structure of multicolor luminaire used in the second embodiment of the present invention.

Please refer to FIG. 4 and FIG. 5, external structure diagram of multicolor luminaire of the present invention Embodiment 2. Multicolor luminaire 5 contains aluminum alloy main body 10, illumination curved surface 11, heat dissipating fin 12, LED 3D curved lead frame 6a, spiral joint 17, multicolor LED chip 92 and transparent package 15; when the luminaire of this embodiment is installed on the ceiling, spiral joint 17 is located at the top, illumination curved surface 11 is located at the bottom, and illumination curved surface 11 becomes spherical shape, which is connected with heat dissipating fin 12. LED 3D curved lead frame 6a is installed on illumination curved surface 11. The surface has transparent package 15 that is used to protect LED 3D curved lead frame 6a and multicolor LED chip 92; and multicolor LED chip 92 is installed in installation seat 64. Power hole 111 on illumination curved surface 11 is used to enable power wire is connected to power contact 631 and power contact 632 of LED 3D curved lead frame 6a from the inside of main body 10, which has outward extended heat dissipating fin 12, first protruding downward and extending to lateral part of heat dissipating fin 121 at external broadside. The middle part of illumination curved surface 11 is equipped with air hole 112 to enable the heat generated from multicolor LED chip 92 on LED 3D curved lead frame 6a to be directly transmitted to heat dissipating fin 12 via aluminum alloy illumination curved surface 11, that is, the heat can be directly dissipated from the back of illumination curved surface 11 and the surface of heat dissipating fin 12 surface. Because multicolor LED chip 92 and illumination curved surface 11 are located below, when the heat is transmitted to heat dissipating fin 12, external surface of heat dissipating fin 12 will heat the air to enable the hot air to ascend and flow due to buoyancy along lateral part of heat dissipating fin 121 at external broadside, that is, the cold air will constantly flow in through air hole 112 to cool the back of illumination curved surface 11 and heat dissipating fin 12; if luminaire 5 is installed at the opposite direction. The cooled air will also flow at the opposite direction, and large quantity of hot air will flow out through air hole 112; these air flows can reduce the thickness of thermal boundary layer of heat dissipating surface, and increase heat convection coefficient and help the heat dissipation; because LED 3D curved lead frame 2a is installed on the projecting illumination curved surface 11, light projection direction of luminaire 5 will be very easily controlled according to radius of curvature of illumination curved surface 11. The bigger the radius of curvature is, the more uniform the light will project downward; and the smaller the radius of curvature is, the bigger light projection angle will be; if illumination curved surface 11 is indented spherical surface, the bigger the radius of curvature is, the longer focusing distance of light will be; and the smaller radius of curvature is, the shorter focusing distance of light will be; if the brightness distribution of projection light should be further controlled, the circuit can be further divided into loop in smaller unit to generate more uniform projection light; because the position of white light LED chip 92 on illumination curved surface 11 is designed according to the demand of light projection, then design the required circuit on illumination curved surface 11, and spread curved circuit into plane circuit and produce into LED flat lead frame 6 (as per FIG. 6(A)). Therefore, LED 3D curved lead frame 6*a* can be correctly pasted on illumination curved surface 11 with insulating heat conduction cement 28 in order to ensure the distribution of projection light is in conformity with the original design, and ensure to have the maximum heat dissipating area.

Please refer to FIG. 5, profile structure diagram of multicolor luminaire of the present invention Embodiment 2. The luminaire of this embodiment is installed on the ceiling, spiral joint 17 is located at the top, illumination curved surface 11 is located at the bottom, and illumination curved surface 11 becomes spherical shape, which is connected with heat dissipating fin lower part 122. LED 3D curved lead frame 6*a* is installed on illumination curved surface 11, transparent package 15 on its surface is equipped with air hole 151, and connected with air hole 112; the inside of main body 10 is one cylindrical space 14, where is installed with control circuit 18, and used to provide stable voltage and current to ensure the service life of multicolor LED chip 92 and provide plural-section multicolor light switching function, containing the color change from any monochromatic light to white light. The high potential electrode contact is connected to power contact 171 on the front end of spiral joint 17 via wire 182; the low potential electrode contact is connected to the broadside of spiral joint 17 with wire 181; the space between cylindrical space 14 of main body 10 and illumination curved surface 11 is connected with heat dissipating fin lower part 122, enabling hot and cold air to generate convection. The heat generated by white light LED chip 92 will be first dissipated by heat dissipating fin lower part 122. Because the cooled air flow with natural convection is available, there will not be too much heat transmitted to cylindrical space 14 to influence control circuit 18, and the opening of cylindrical space 14 is sealed and combined with spiral joint 17, enabling the heat generated by control circuit 18 to be dissipated via the wall surface of cylindrical space 14 and lateral part of heat dissipating fin 121, and both of them have big heat dissipating surfaces.

Figure 6A:
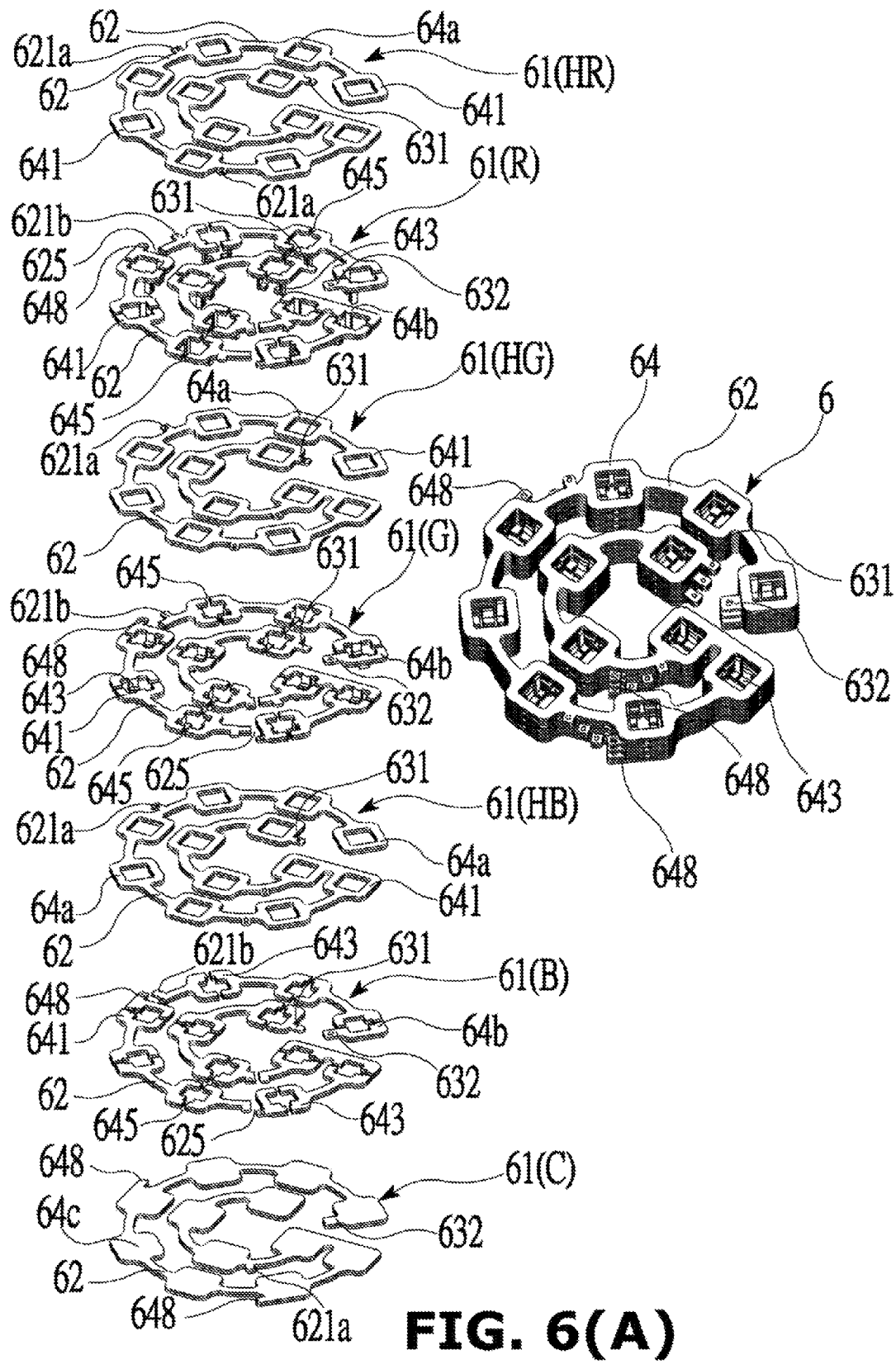
FIG. 6(A) illustrates layered structure of multicolor LED flat lead frame diagram used in the second embodiment of the present invention.
Figure 6B:
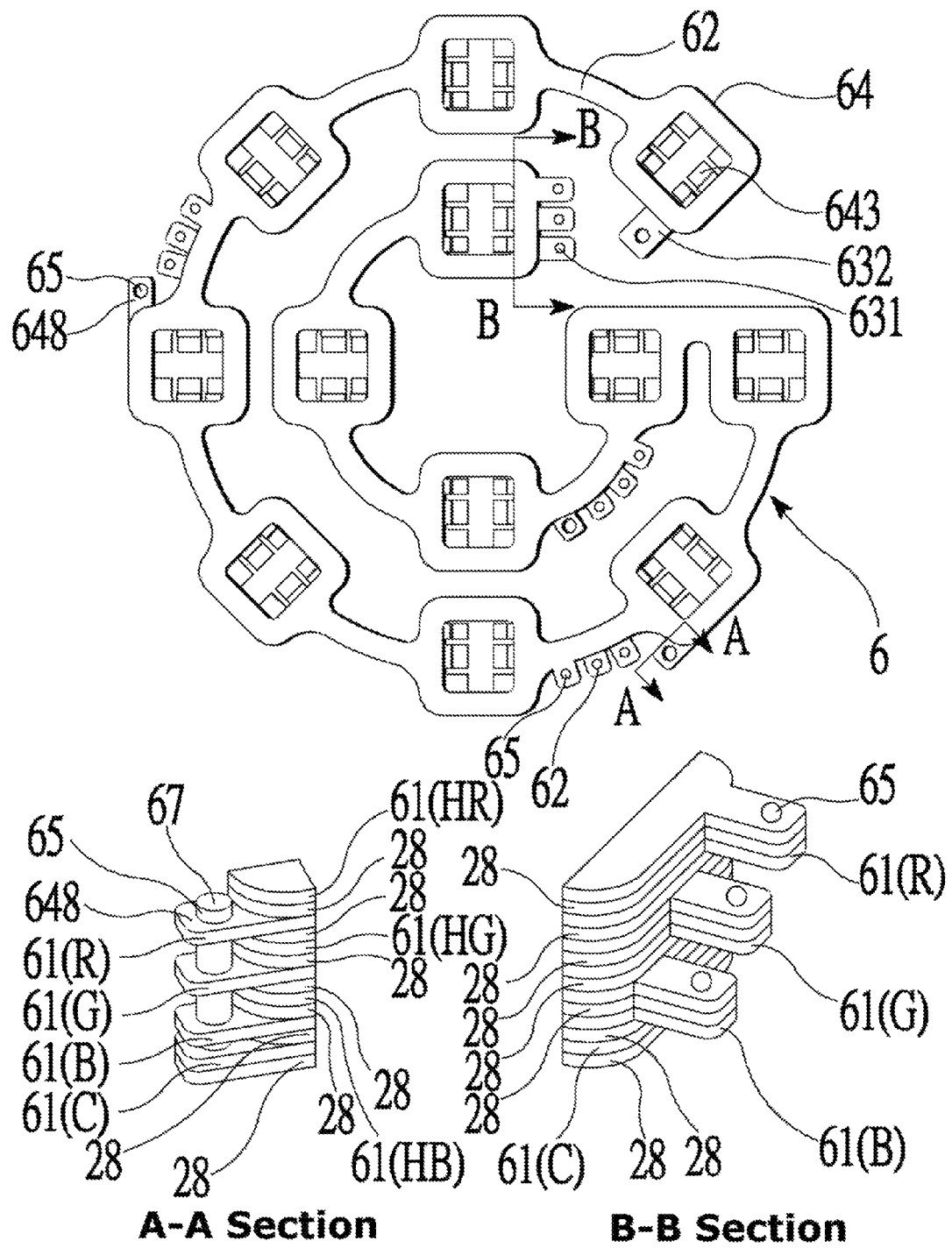
FIG. 6(B) illustrates structure of conductive through hole and power contact of multicolor LED flat lead frame used in the second embodiment of the present invention.

Please refer to FIG. 5, FIG. 6(A) and FIG. 6(B), layered structure diagram of multicolor LED flat lead frame of Embodiment 2 of the present invention. The circuit of this embodiment includes four groups of three multicolor LED chips 92 under series connection and then parallel connection, totaling 12 multicolor LED chips 92. LED flat lead frame 6 has the plane circuit spread from illumination curved surface 11, consisting of two linked concentric circle arc curves. The middle arc is installed with four LED chips 92, and the peripheral arc is installed with eight LED chips 92, which are superimposed by seven layers of monolithic lead frames 61.

High potential monolithic lead frame 61(HR) belongs to continuous lead frame, which is used as red light high potential parallel contact of series circuit. Series circuit monolithic lead frame 61(R) is serial lead frame, which is divided into four series circuit section with insulating joint 625 on wire 62, and used to constitute red light series circuit of four groups of three LED chips 92.

High potential monolithic lead frame 61(HG) belongs to continuous lead frame, which is used as green light high potential parallel contact of series circuit. Series circuit monolithic lead frame 61(G) is serial lead frame, which is divided into four series circuit sections with insulating joint 625 on wire 62, and used to constitute green light series circuit of four groups of three LED chips 92.

High potential monolithic lead frame 61(HB) belongs to continuous lead frame, which is used as blue light high potential parallel contact of series circuit. Series circuit monolithic lead frame 61(B) is serial lead frame, which is divided into four series circuit sections with insulating joint 625 on wire 62, and used to constitute blue light series circuit of four groups of three LED chips 92.

Low potential monolithic lead frame 61(C) belongs to continuous lead frame, which is used as low potential parallel contact of each series circuit.

The structure of high potential monolithic lead frame 61(HR) contains wire 62, power contact 631, high potential connecting point 621*a*, installation seat 64*a* and other parts; power contact 631 is installed on the front end of circuit, which is equipped with conductive through hole 65 above; lead frame 61(HR) is equipped with 12 installation seats 64*a*, which are mutually connected with wire 62. Installation seat 64*a* has hollow annular installation seat wire 641; high potential connecting point 621*a* is installed according to high potential connecting point 621*b* of series circuit monolithic lead frame 61(R). The conductive through hole 65 is equipped above; power contact 631 and conductive through hole 65 of high potential connecting point 621*a* can be dripped with conductive adhesive 29, which is used to connect power contact 631 and high potential connecting point 621*b* of monolithic lead frame 61(R) and enable to become parallel contact of high potential.

Series circuit monolithic lead frame 61(R) adopts insulating joint 625 to divide the circuit into one group of four parallel circuit sections connected with three multicolor LED chips 92 under series connection. The structure of circuit section contains wire 62, power contact 631, high potential connecting point 621*b*, low potential connecting point 648, installation seat 64*b* and other parts; the front end of the first circuit section is installed with one power contact 631 and tail end is installed with one low potential chaining point 648. The front ends of the rest circuit sections are installed with one high potential connecting point 621*b* and tail end is installed with one low potential connecting point 648. Conductive through hole 65 installed on low potential connecting point 648. Each circuit section has three installation seats 64*b* connected with wire 62, and installation seat wire 641 of installation seat 64*b* is equipped with insulating joint 645 to constitute one group of electrode contact of high and low potential 643. The high potential of each circuit section is connected with power contact 631 and high potential connecting point 621*b* by dripping conductive adhesive 29 in conductive through hole 65 on monolithic lead frame 61(HR), and low potential of each group of circuit is connected with low potential connecting point 648 of connect monolithic lead frame 61(C) by dripping conductive adhesive 29 in the conductive through hole 65 via low potential connecting point 648 on monolithic lead frame 61(R), and passing through conductive metal wire 67.

The structure of high potential monolithic lead frame 61(HG) contains wire 62, power contact 631, high potential connecting point 621*a*, installation seat 64*a* and other parts; power contact 631 is installed on front end of the circuit that is equipped with conductive through hole 65; lead frame 61(HG) is equipped with 12 installation seats 64*a*, mutually connected with wire 62. Installation seat 64*a* has hollow annular installation seat wire 641; high potential connecting point 621*a* is installed according to high potential connecting point 621*b* of series circuit monolithic lead frame 61(G), which is equipped with conductive through hole 65 above; conductive through holes 65 of power contact 631 and high potential connecting point 621*a* can be dripped with conductive adhesive 29, used to connect power contact 631 and high potential connecting point 621*b* of monolithic lead frame 61(G), enabling it to become parallel contact of high potential.

Series circuit monolithic lead frame 61(G) adopts insulating joint 625 to divide the circuit into one group of four parallel circuit sections connected by three multicolor LED chips 92 under series connection. The structure of circuit section contains wire 62, power contact 631, high potential connecting point 621*b*, low potential connecting point 648, installation seat 64*b* and other parts; the front end of the first circuit section is installed with one power contact 631 and tail end is installed with one low potential chaining point 648. The front ends of the rest circuit sections are installed with one high potential connecting point 621*b* and tail end is installed with one low potential connecting point 648. Conductive through hole 65 is installed on low potential connecting point 648. Each circuit section has three installation seats 64*b*, connected with wire 62, and installation seat wire 641 of installation seat 64*b* is equipped with insulating joint 645 to constitute one group of electrode contact of high and low potential 643. The high potential of each circuit section is connected with power contact 631 and high potential connecting point 621*b* by dripping conductive adhesive 29 in conductive through hole 65 on monolithic lead frame 61(HG), and low potential of each group of circuit is connected with low potential connecting point 648 of connect monolithic lead frame 61(C) by dripping conductive adhesive 29 in the conductive through hole 65 via low potential connecting point 648 on monolithic lead frame 61(G), and passing through conductive metal wire 67.

The structure of high potential monolithic lead frame 61(HB) contains wire 62, power contact 631, high potential connecting point 621*a*, installation seat 64*a* and other parts; power contact 631 is installed on the front end of the circuit that is equipped with conductive through hole 65; lead frame 61(HB) is equipped with 12 installation seats 64*a*, mutually connected with wire 62. Installation seat 64*a* has hollow annular installation seat wire 641; high potential connecting point 621*a* is installed according to high potential connecting point 621*b* of series circuit monolithic lead frame 61(B), which is equipped with conductive through hole 65 above; conductive through holes 65 of power contact 631 and high potential connecting point 621*a* can be dripped with conductive adhesive 29 to connect power contact 631 and high potential connecting point 621*b* of monolithic lead frame 61(B), enabling it to become parallel contact of high potential.

Series circuit monolithic lead frame 61(B) adopts insulating joint 625 to divide the circuit into one group of four parallel circuit sections connected with three multicolor LED chips 92 under series connection. The structure of circuit section contains wire 62, power contact 631, high potential connecting point 621*b*, low potential connecting point 648, installation seat 64*b* and other parts; the front end of the first circuit section is installed with one power contact 631 and tail end is installed with one low potential chaining point 648. The front ends of the rest circuit sections are installed with one high potential connecting point 621*b* and tail end is installed with one low potential connecting point 648. Conductive through hole 65 is installed on low potential connecting point 648. Each circuit section has three installation seats 64*b*, connected with wire 62, and installation seat wire 641 of installation seat 64*b* is equipped with insulating joint 645 to constitute one group of electrode contact of high and low potential 643. The high potential of each circuit section is connected with power contact 631 and high potential connecting point 621*b* by dripping conductive adhesive 29 in conductive through hole 65 on monolithic lead frame 61(HR), and low potential of each group of circuit is connected with low potential connecting point 648 of connect monolithic lead frame 61(C) by dripping conductive adhesive 29 in the conductive through hole 65 via low potential connecting point 648 on monolithic lead frame 61(B), and passing through conductive metal wire 67.

The structure of low potential monolithic lead frame 61(C) contains wire 62, power contact 632, low potential connecting point 648, installation seat 64*c* and other parts; power contact 632 installed on tail end of the circuit; lead frame 61(C) is equipped with 12 installation seats 64*c*, mutually connected with wire 62. Installation seat 64*c* is solid tabular; low potential chaining points 648 is installed according to low potential connecting point 648 of series circuit monolithic lead frame 61, which can pass through each layer of conductive through hole 65 of low potential connecting point 648 to install conductive metal 67 and drip conductive adhesive 29 in the hold and connect low potential connecting point 648 of each single-layer series lead frame.

Wire 62 and installation seat 64 of each monolithic lead frame 61 of LED flat lead frame 6 has the same overall dimension for superimposition. Installation seat 64 is superimposed by installation seat 64*a*, installation seat 64*b* and installation seat 64*c*. Electrode contact 643 of installation seat 64*b* is located in relative position and flexed to the same level to constitute one group of high and low potential electrode contact. The space can be used to install LED chip 92 and enable electrode contact to be fixed on each electrode contact by dripping conductive adhesive 29. The underside of monolithic lead frame 61(C) is directly pasted on illumination curved surface 11 with insulating heat conduction cement 28.

Embodiment 3 is LED 3D curved lead frame of the present invention that is applied in curved or spherical multicolor advertising boards and illumination device.

Please refer to FIG. 7(A), FIG. 7(B), FIG. 8 and FIG. 9, multicolor LED curved display advertising board module structure diagram of Embodiment 3 of the present invention. Multicolor advertising board module 7 contains aluminum alloy main body curved surface 71 and LED 3D curved lead frame 8*a*. The circuit of this embodiment is 16×16 series connection multicolor LED chip 93. LED 3D curved lead frame 8*a* takes banded structure to arrange in matrix shape on curved surface 71 under series connection. Curved surface 71 of aluminum alloy main body is equipped with through hole 711, which enables power contact 831(V) and power contact 834(G) as well as timing sequence contact 832(C) and signal contact 833(S) of LED 3D curved lead frame 8*a* to be connected to controller and image decoder of display system. Chip 93 is the integrated package chip that contains drive chip and RGB three-color chip and necessary circuit, and drive chip has serial communication interface (SD), timing sequence interface (CLK), high potential interface (VCC) and low potential interface (GND), which are respectively represented by S, C, V and G. LED 3D curved lead frame 8*a* is spread into LED flat lead frame 8, which is superimposed by four layers of monolithic lead frame 81.

Monolithic lead frame 81(V) of high potential interface (VCC) belongs to continuous lead frame, which is used as parallel connection high potential contact 843(V) of LED chip 93. Installation seat wire 841 of installation seat 84*a* is hollow annular and installation seat wire 841 is equipped with high potential contact 843(V), and used to joint high potential contact (VCC) of LED chip 93.

Monolithic lead frame 81(S) of serial communication interface (SD) is serial lead frame, which is used to connect serial communication interface (SD) of LED chip 93. Hollow annular installation seat wire 841 of installation seat 84*b* is equipped with insulating joint 845 to constitute one group of signal input and output contact 843(S) of serial communication interface, which is used to joint signal input contact (SDI) and signal output contact (SDO) of LED chip 93.

Monolithic lead frame 81(C) of timing sequence interface (CLK) is serial lead frame, which is used to connect timing sequence interface (CLK) of LED chip 93. Hollow annular installation seat wire 841 of installation seat 84*b* is equipped with insulating joint 845 to constitute one group of input and output contact 843(C) of timing sequence interface, which is used to joint timing sequence input contact (CLKI) and timing sequence output contact (CLKO) of LED chip 93.

Monolithic lead frame 81(G) of low potential interface (GND) belongs to continuous lead frame, which is used as parallel connection low potential contact 843(G) of LED chip 93. Installation seat wire 841 of installation seat 84*a* is hollow annular and equipped with low potential contact 843(G), which is used to joint low potential contact (GND) of LED chip 93.

The structure of monolithic lead frame 81(V) of high potential interface (VCC) contains wire 82, power contact 831(V), installation seat 84*a* and other parts; power contact 831(V) is installed on the front end of the circuit; lead frame 81(V) is equipped with 16×16 installation seats 84*a*, mutually connected with wire 82. Installation seat 84*a* has hollow annular installation seat wire 841, where is equipped with high potential contact 843(V).

The structure of serial communication interface (SD) monolithic lead frame 81(S) contains wire 82, power contact 833(S), installation seat 84*b* and other parts; front end of monolithic lead frame 81(S) is installed with one power contact 833(S); lead frame 81(S) is equipped with 16×16 installation seats 84*b*, mutually connected with wire 82. Installation seat 84*b* has hollow annular installation seat wire 841, where is equipped with insulating joint 845, and respectively equipped with one group of serial communication contact 843(S).

The structure of timing sequence interface (CLK) monolithic lead frame 81(C) contains wire 82, power contact 832(C), installation seat 84*b* and other parts; front end of monolithic lead frame 81(C) is installed with one power contact 832(C); lead frame 81(C) is equipped with 16×16 installation seats 84*b*, mutually connected with wire 82. Installation seat 84*b* has hollow annular installation seat wire 841, where is equipped with insulating joint 845, and respectively equipped with one group of timing sequence contact 843(C) of timing sequence interface.

The structure of low potential interface (GND) monolithic lead frame 81(G) contains wire 82, power contact 834(G), installation seat 84*a* and other parts; power contact 834(G) is installed on the front end of the circuit; lead frame 81(G) is equipped with 16×16 installation seats 84*a*, mutually connected with wire 82. Installation seat 84*a* has hollow annular installation seat wire 841, where is equipped with low potential contact 843(G).

Wire 82 and installation seat 84 of each monolithic lead frame 81 of LED flat lead frame 8 has the same overall dimension for superimposition. Installation seat 84 is superimposed by installation seat 84*a* and installation seat 84*b*. Electrode contact 843 of installation seat 84*a* and installation seat 84*b* is located in relative position and flexed to the same level to constitute LED chip 93 contact group. The space can be used to install LED chip 93 and fix each contact 843 by dripping conductive adhesive 29. The underside of monolithic lead frame 81(G) is directly pasted on illumination curved surface 71 with insulating heat conduction cement 28.

Figure 7A:
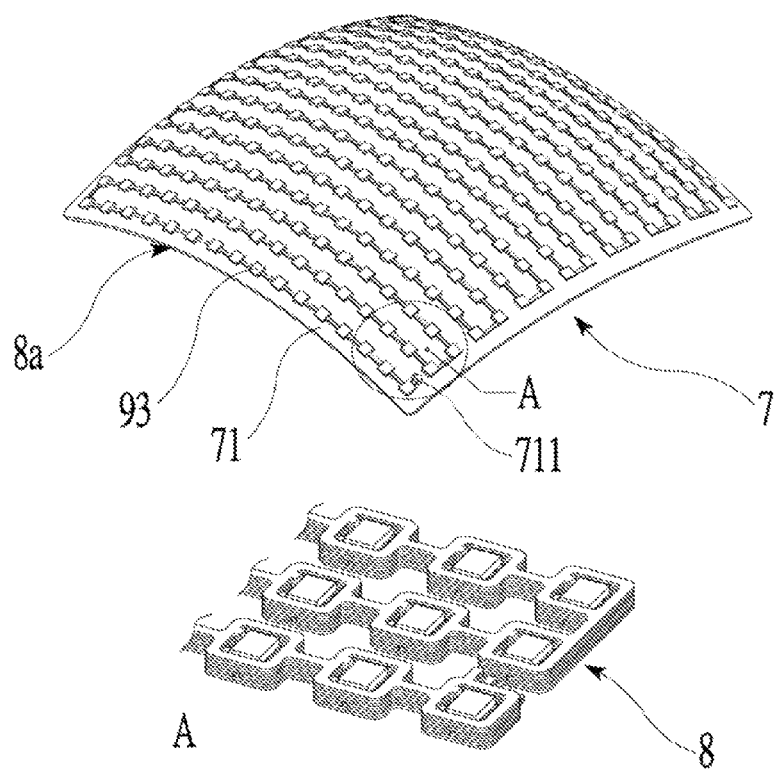
FIG. 7(A) illustrates structure of multicolor LED curved display advertising board module used in the third embodiment of the present invention.
Figure 7B:
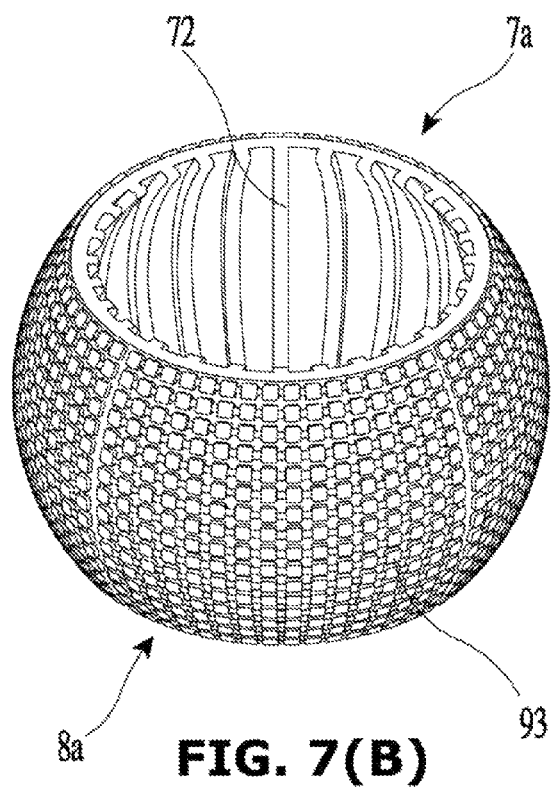
FIG. 7(B) illustrates structure of multicolor LED circumferential spherical advertising board used in the third embodiment of the present invention.
Figure 8:
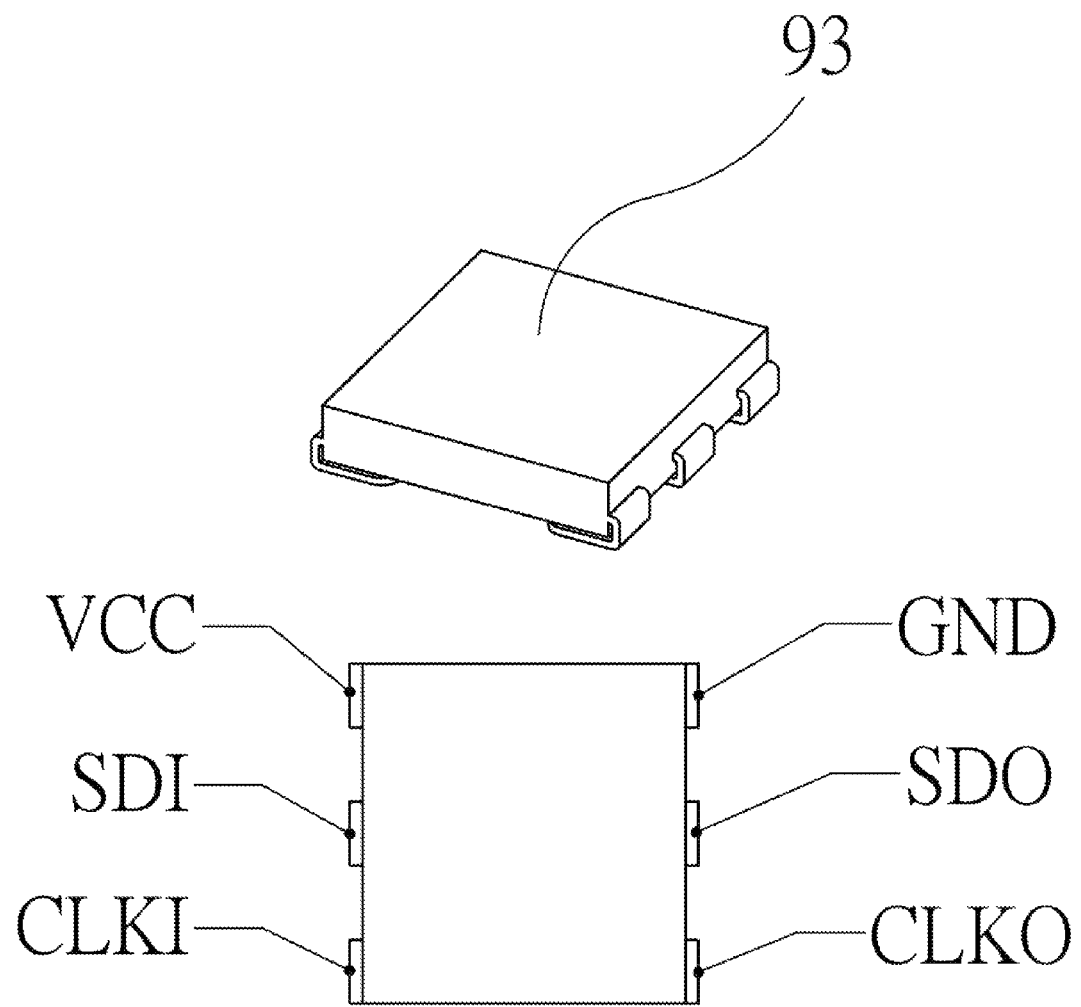
FIG. 8 illustrates LED chip used in the third embodiment of the present invention.
Figure 9:
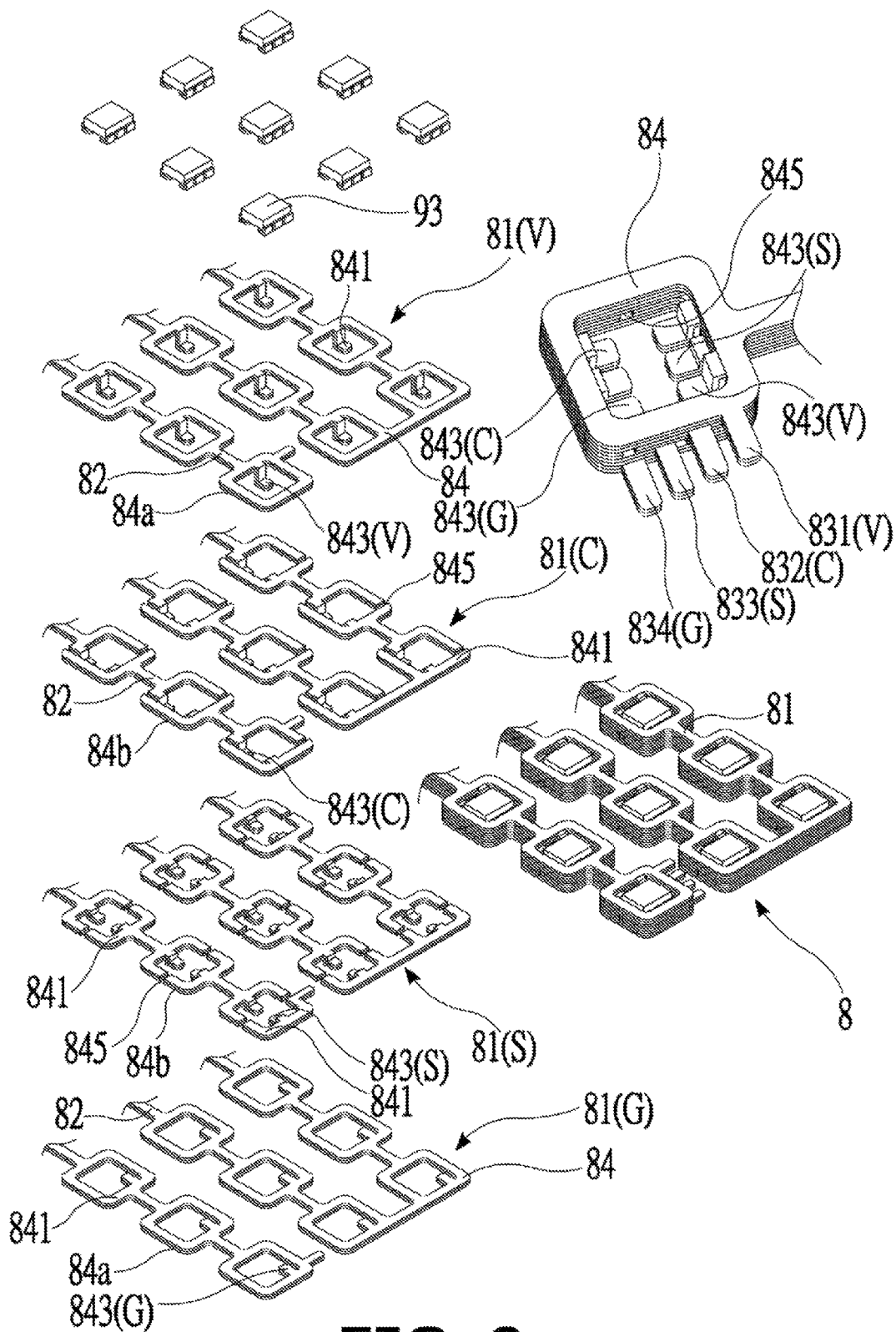
FIG. 9 illustrates layered structure of multicolor LED flat lead frame of display advertising board used in the third embodiment of the present invention.

Please refer to FIG. 7(B), structure diagram of circumferential spherical advertising board consists of multicolor LED curved display advertising board module of the present invention Embodiment 3. This legend illustrates one circumferential and curved display advertising board 7*a* consists of four pieces of LED 3D curved lead frames 8*a* in order to explain that this innovative method can meet the demand of various illumination curved surfaces; aluminum alloy main body 71 is circumferential spherical structure. The inside can be installed with plural heat dissipating fins 72 to reinforce the heat dissipating efficiency of LED chip 93; when white light LED chip 91 is used for illumination purpose, plural heat dissipating fins 72 can even exert the heat dissipating effect.

Embodiment 4 illustrates the manufacturing method of LED flat lead frame of white light LED luminaire of the present invention Embodiment 1.

Figure 10:
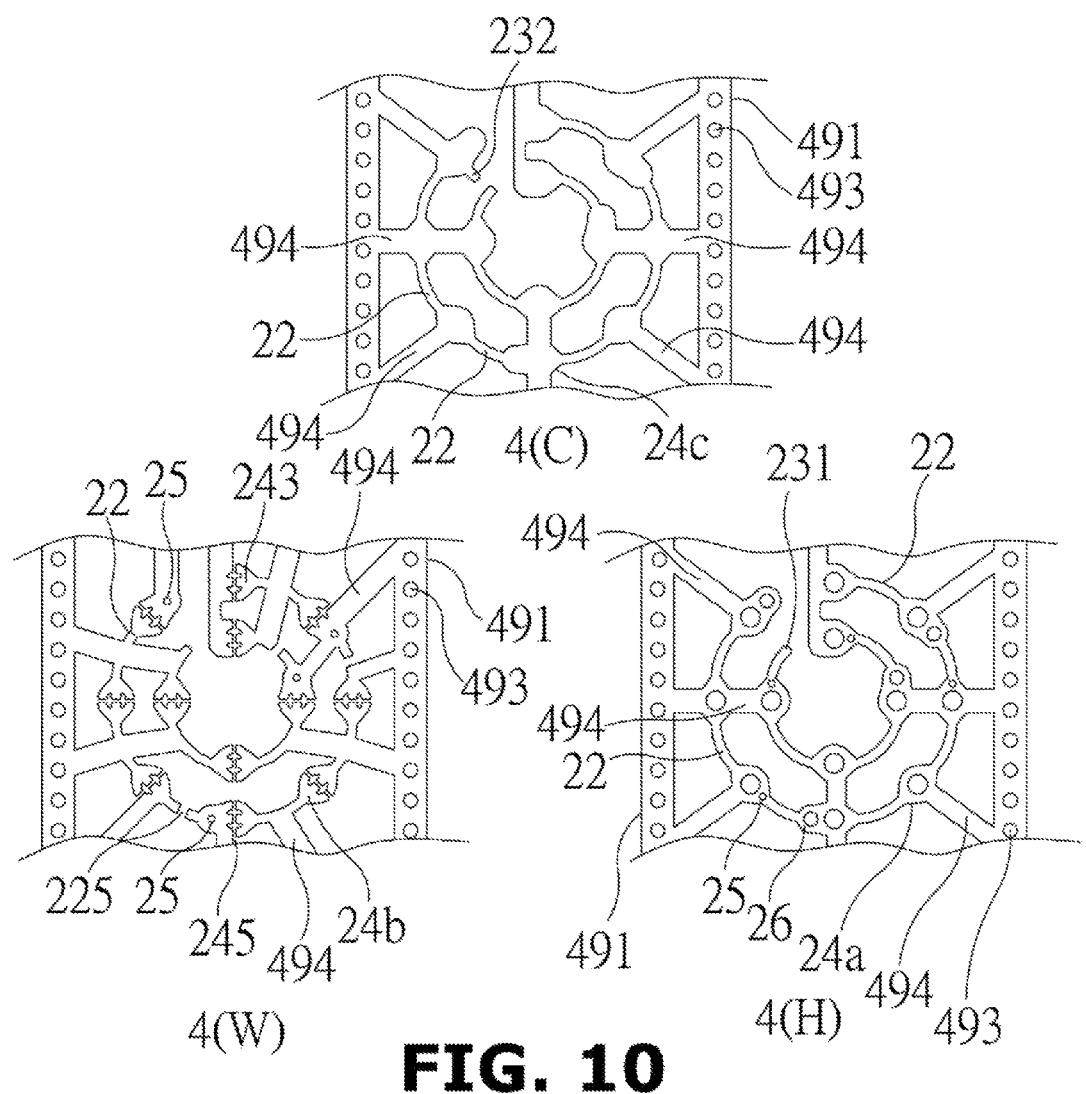
FIG. 10 illustrates structure of charge tape of white light LED flat lead frame used in the fourth embodiment of the present invention.

Please refer to FIG. 10 and FIG. 3(A), the structure of charge tape 4 of LED flat lead frame 2 of the present invention. LED flat lead frame 2 consists of two connected concentric circle arc curves. The middle arc is installed with four LED chips 91. The peripheral arc is installed with eight LED chips 91, superimposed by three layers of monolithic lead frame 21. The circuit contains 12 LED chips 91 connected by four groups of three white light LED chips 91 under series connection and then parallel connection. This figure aims to explain how to use charge tape 4 to finish the production of each monolithic lead frame 21; charge tape 4(H) of this embodiment is used to produce high potential monolithic lead frame 21(H), charge tape 4(W) is used to produce series circuit monolithic lead frame 21(W), and charge tape 4(C) is used to produce low potential monolithic lead frame 21(C).

The patterns of the required single-layer lead frame 21 are respectively and properly arranged on three pieces of conductive sheet metals with the same dimensions. The back of sheet metal has insulating layer 28 to prevent against circuit short circuit. Respectively conduct the first processing of conductive sheet metal to get the prototype with basic dimension of lead frame 21. Each charge tape 4 is explained as follows:

Charge tape 4(H) uses connecting parts 494 with various shapes to connect wire 22, installation seat 24*a* and power contact 231 into cellular structure, and produce conductive through hole 65, insulating through hole 26 and hollow ring-shaped installation seat wire 241 by processing.

Charge tape 4(W) uses connecting parts 494 with various shapes to connect wire 22 and installation seat 24*b*, and divide the circuit into several sections with insulating joint 225 and insulating joint 245. Connected them with connecting part 494 into cellular structure, and produce conductive through hole 65, insulating joint 225 and insulating joint 245 by processing.

Charge tape 4(W) uses connecting parts 494 with various shapes to connect wire 22, installation seat 24c and low potential power contact 232 into cellular structure.

The prototype of flat lead frame at this time has been formed in charge tape 4, and there are plural prototypes are connected in series in one piece of charge tape 4. At this time, processing surface of insulating through hole 26 of charge tape 4(H) should be pasted with insulating cement 28. Connecting part 494 of charge tape 4(W) can ensure stable position of electrode contact 243 of high and low potential; broadside 491 of each charge tape 4 is equipped with plural charge tape locating holes 493. Install these three pieces of charge tape 4 on the jig and paste them with insulating heat conduction cement 28. Wire 22 and installation seat 24 of each single-layer lead frame will be superimposed due to the with the same dimensions, and hollow annular installation seat wire 241 of charge tape 4(H) enables installation seat 24a as the installation space of white light LED chip 91. Drip conductive adhesive 29 on each electrode contact 243 with glue dispersion machine to install white light LED chip 91, and drip conductive adhesive 29 in each conductive through hole 65, conduct heating and solid jointing to enable white light LED chip 91 to be stably combined into series circuit and break-over parallel circuit, then cut off connecting part 494 to become LED flat lead frame 2, and both ends have high potential power contact 231 and low potential power contact 232.

What is claimed is:

1. A process of making an LED 3D curved lead frame of an illumination device, comprising:
    providing a multilayer lead frame structure;
    the multilayer lead frame structure having a plurality of monolithic lead frames;
    setting a thickness of each of plurality of monolithic lead frames from 0.05 mm to 2 mm;
    setting a width of each of plurality of monolithic lead frames from 1 mm to 10 mm;
    each of the plurality of monolithic lead frames having a plurality of seats, a plurality of wires and a plurality of connecting parts;
    each of the plurality of wires connecting two adjacent seats among the plurality of seats;
    each of the plurality of seats having an electrode contact;
    providing a plurality of conductive adhesives;
    infusing each of the plurality of conductive adhesives on each of the plurality of electrode contacts;
    providing a plurality of LED chips;
    installing each of the plurality of LED chips into each of the plurality of seats;
    pasting each of the plurality of LED chips on each of the plurality of electrode contacts through each of the plurality conductive adhesives;
    conducting heating and solidification to each of the plurality of conductive adhesives so as to secure each of the plurality of LED chips with each of the plurality of seats;
    providing a banded metal plate;
    arranging the plurality of monolithic lead frames on the banded metal plate;
    providing a plurality of insulating heat conduction cements;
    connecting two adjacent monolithic lead frames among the plurality of monolithic lead frames with each other and connecting the most underside monolithic lead frame among the plurality of monolithic lead frames with the banded metal plate through each of the plurality of insulating heat conduction cements; and
    cutting off the connecting part.

* * * * *